United States Patent
Hwang et al.

(10) Patent No.: US 6,826,082 B2
(45) Date of Patent: Nov. 30, 2004

(54) PROGRAMMABLE MEMORY DEVICES WITH LATCHING BUFFER CIRCUIT AND METHODS FOR OPERATING THE SAME

(75) Inventors: Sang-Won Hwang, Gyeonggi-do (KR); Sung-Soo Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/403,739

(22) Filed: Mar. 31, 2003

(65) Prior Publication Data

US 2003/0210576 A1 Nov. 13, 2003

(30) Foreign Application Priority Data

May 13, 2002 (KR) ............................... 10-2002-0026259

(51) Int. Cl.[7] .............................................. G11C 16/04
(52) U.S. Cl. ............................. 365/185.17; 365/185.22
(58) Field of Search ........................ 365/185.17, 185.22, 365/189.05

(56) References Cited

U.S. PATENT DOCUMENTS

| | | | | |
|---|---|---|---|---|
| 5,696,717 A | 12/1997 | Koh | ...................... | 365/185.22 |
| 5,732,018 A | 3/1998 | Choi et al. | ............. | 365/185.17 |
| 5,768,188 A | 6/1998 | Park et al. | ............. | 365/185.03 |
| 5,768,191 A | 6/1998 | Choi et al. | ............. | 365/185.22 |
| 5,862,074 A | 1/1999 | Park | ...................... | 365/185.03 |
| 6,181,606 B1 | 1/2001 | Choi et al. | ............. | 365/185.23 |
| 6,304,486 B1 * | 10/2001 | Yano | ...................... | 365/185.22 |
| 6,480,419 B2 * | 11/2002 | Lee | ........................ | 365/185.18 |
| 6,687,158 B2 * | 2/2004 | Yano | ...................... | 365/185.17 |

* cited by examiner

Primary Examiner—Vu A. Le
(74) Attorney, Agent, or Firm—Myers Bigel Sibley & Sajovec (57) ABSTRACT

Programmable memory devices include a memory cell having an associated bit line. A buffer circuit couples the bit line to a data line. The buffer circuit has a sense node coupled to the bit line and includes a latch circuit having a latch node coupled to the data line. A control circuit resets the latch node between a program operation of the memory cell and its corresponding program-verify operation. The memory devices may be NAND-type flash memory devices and the memory cell may be one of a string of memory cells connected in series between the bit line and a common source line. A transistor may couple the data line to the latch node and a transistor may couple the latch node to the sense node. Methods of operating the same are also provided.

28 Claims, 8 Drawing Sheets

(Related Art)

PROGRAMMABLE MEMORY DEVICES WITH LATCHING BUFFER CIRCUIT AND METHODS FOR OPERATING THE SAME

RELATED APPLICATION

This application claims priority to Korean Patent Application 2002-0026259, filed on May 13, 2002, the contents of which are herein incorporated by reference in their entirety.

BACKGROUND OF THE INVENTION

The present invention relates to semiconductor memory devices, and in particular to electrically programmable semiconductor memory devices.

A variety of different types of memory devices are known, including read only memory (ROM), read-write memory and erasable programmable ROM (EPROM). One particular type of EPROM that has proven desirable in various applications is electrically erasable PROM (EEPROM), which may be erased and programmed, but, unlike certain read-write memory, may be operated without needing to refresh data stored in the memory. There is also a trend toward enhancing the storage capacity and the density of integration in such memory devices. A NAND-type flash memory is one example of an EEPROM non-volatile semiconductor memory that may provide high capacity and integration density without the need for refreshing stored data.

Figure 1:
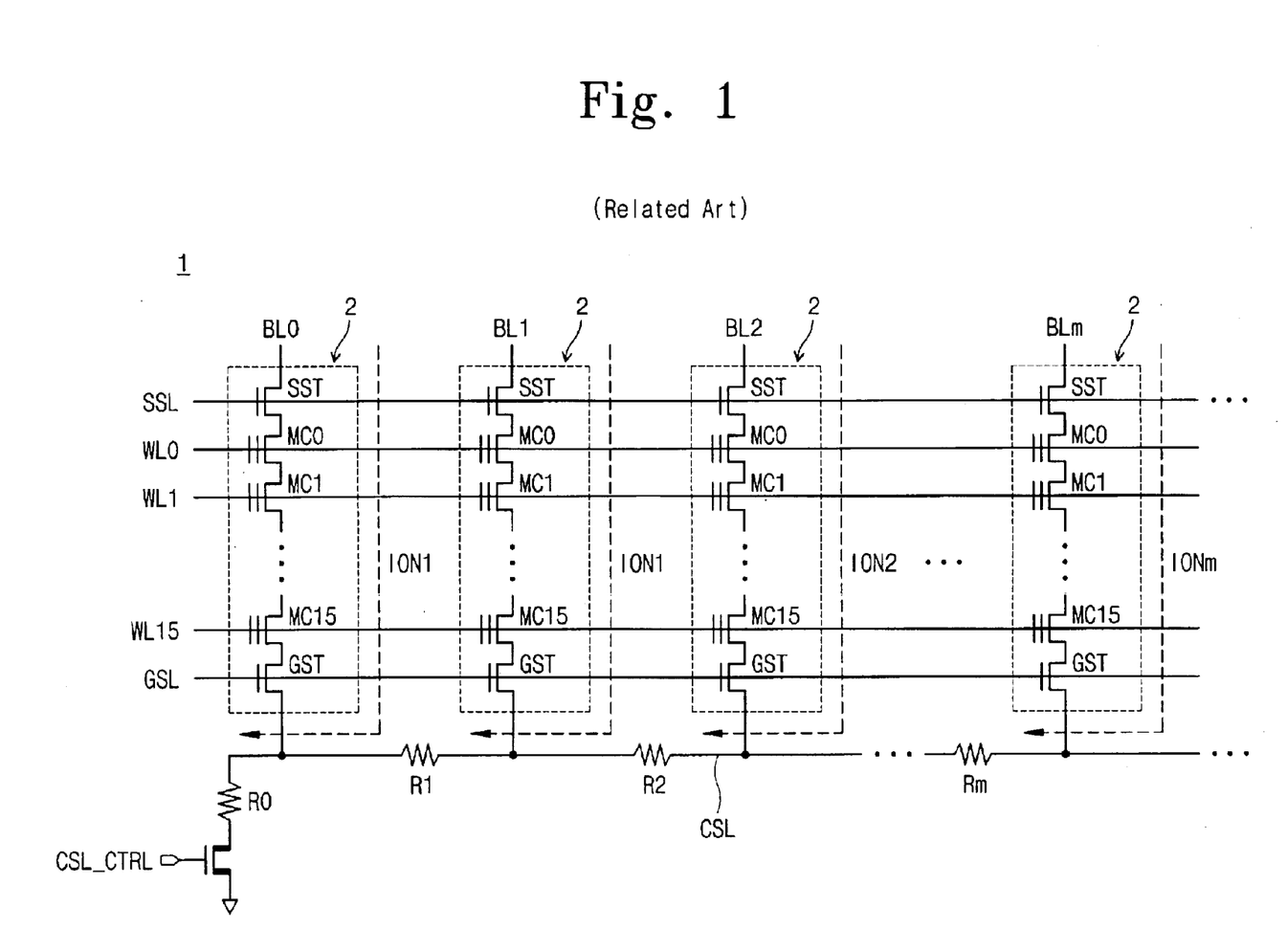
FIG. 1 is a circuit diagram illustrating a memory cell array of a conventional NAND-type flash memory device.

FIG. 1 is a circuit diagram illustrating an exemplary memory cell array for a conventional NAND-type flash memory device. As shown in FIG. 1, a memory cell array 1 includes a plurality of memory cell strings 2 extending in a column direction of the memory cell array. Each of the strings 2 includes a string selection transistor SST, a ground selection transistor GST, and a plurality of memory cells, shown in FIG. 1 as sixteen (16) memory cells MC0–MC15 connected in series between the selection transistors SST and GST. A drain of the string selection transistor SST in each column is connected to a corresponding bit line, and its gate is connected to a string selection line SSL. A source of the ground selection transistor GST is connected to a common source line CSL and its gate is connected to a ground selection line GSL. Each of the memory cells MC0–MC15 is illustrated as a floating gate transistor that has a control gate, a floating gate, a source, and a drain. The control gates of the memory cells MC0–MC15 in each string are coupled to respective word lines WL0–WL15 defining the rows of the memory cell array.

NAND-type flash memory devices typically program memory cells commonly connected to a selected word line concurrently. However, with a flash memory device, it is generally not possible to successfully program selected memory cells within a single program cycle. A single program cycle is generally insufficient as memory cells may have different coupling ratios, for example, due to variability of process conditions or materials during manufacture of the memory device. For example, memory cells of a relatively larger coupling ratio are typically programmed more rapidly than those of a relatively smaller coupling ratio. Therefore, when memory cells of a relatively larger coupling ratio are programmed, remaining memory cells having a relatively smaller coupling ratio may be maintained at an erased state.

For such memory devices, following a program operation, it is known to execute a verify operation to determine if the program operation was successful. However, due to the circuit configuration, the potential of the common source line CSL can be increased when the verify operation is carried out. For example, the potential of the common source line CSL may be raised due to the resistances R0–Rm of the common source line CSL and current ION0–IONm flowing through memory cell(s) of an erased state in each string. This effect may be referred to as "CSL noise." As a result of the CSL noise, a memory cell having a threshold voltage programmed to a level lower than a verify or pass voltage may appear to meet the pass voltage level for its threshold during the verify operation. In such a case, an insufficiently programmed memory cell could be seen as a sufficiently programmed memory cell during the verify operation.

Figure 2:
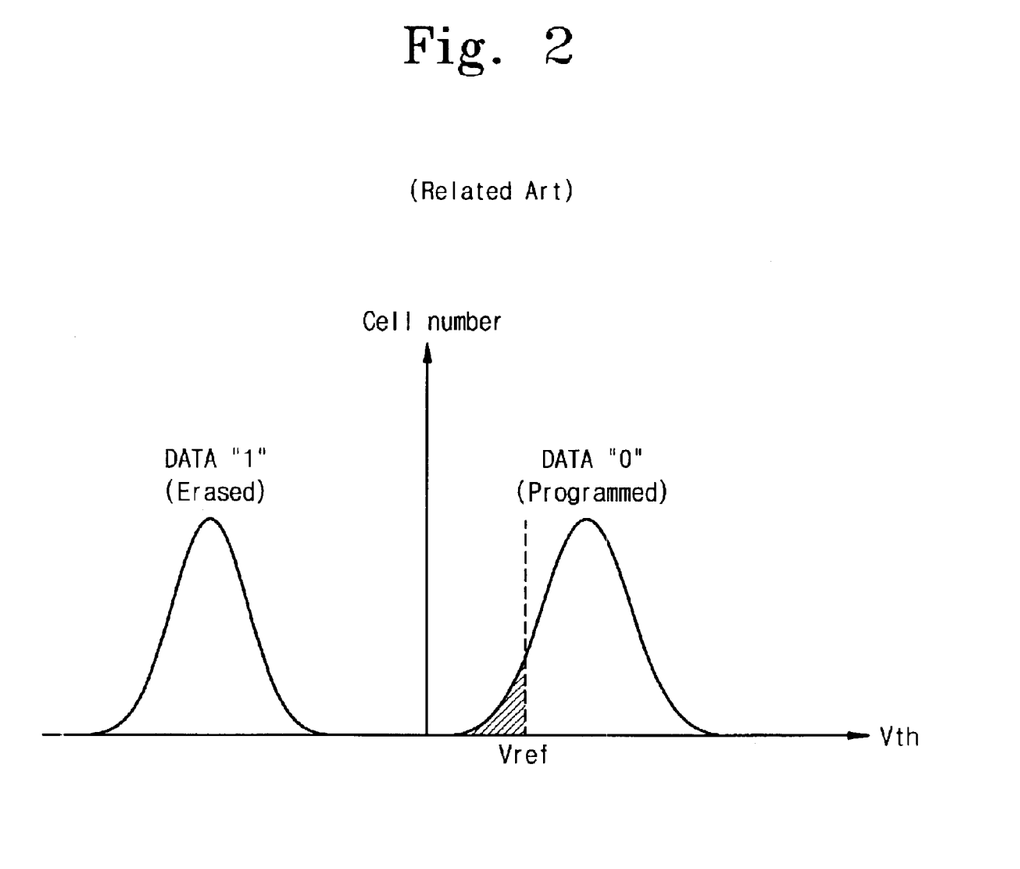
FIG. 2 is a graph illustrating a threshold voltage distribution of on-cells and off-cells for a conventional program-verify operation of the memory cell array of FIG. 1.

By way of example, assume that a selected memory cell (e.g., MC0) is programmed up to a threshold voltage of about 0.3V and that the potential of the common source line CSL is raised by about 0.7V owing to current flowing through some of the memory cells during the verify operation. Under such conditions, the threshold voltage of the selected memory cell may be detected as exceeding 0.7V based on the raised potential of the common source line CSL. Thus, as illustrated in the graphical illustration of FIG. 2, after the program operation, threshold voltages of some of the memory cells can be distributed at voltage levels below the verify reference voltage Vref (e.g., about 0.7V) that corresponds to an off-cell. Therefore, when the program operation is completed, since memory cells having a threshold voltage of about 0.3V are at an under-program state, they may bee judged to be an on-cell during a read operation, resulting in a device failure.

SUMMARY OF THE INVENTION

In some embodiments of the present invention programmable memory devices include a memory cell having an associated bit line. A buffer circuit couples the bit line to a data line. The buffer circuit has a sense node coupled to the bit line and includes a latch circuit having a latch node coupled to the data line. A control circuit resets the latch node between a program operation of the memory cell and its corresponding program-verify operation. The memory devices may be NAND-type flash memory devices and the memory cell may be one of a string of memory cells connected in series between a bit line and a common source line. A transistor may couple the data line to the latch node and a transistor may couple the latch node to the sense node.

In other embodiments of the present invention, the latch circuit includes a first and a second latch circuit. The first latch circuit has a first latch node selectively coupled to a third latch node, which is the latch node of the buffer circuit coupled to the data line, and a second latch node selectively coupled to a first reference voltage. The second latch circuit is coupled to the third latch node and has a fourth latch node coupled to the first reference voltage by a select circuit. The select circuit is responsive to signals on the first latch node and the sense node.

In further embodiments of the present invention, the control circuit is configured to selectively couple the first latch node to the third latch node to latch data on the first latch node during a program operation. The second latch control circuit may be configured to latch the data to the third latch node during the program operation. The control circuit may be configured to maintain program-inhibit data at the third latch node when data on the first latch node or data on the sense node is program-inhibit data. In particular embodiments, the control circuit is configured to reset the first latch node during a read operation and/or to selectively discharge the first latch node responsive to data on the sense node during a read operation. The control circuit may be configured to match data on the third latch node to data on the first latch node after discharge of the sense node during the read operation.

In other embodiments of the present invention, methods for programming a programmable semiconductor memory device include programming a plurality of memory cells of the semiconductor memory device. Latched programming data presented to ones of the plurality of memory cells is reset. After resetting the latched program data, the programming of the plurality of memory cells is verified in a program-verify operation in a single program cycle. In particular embodiments of the present invention, the memory device is a NAND-type flash memory device and the plurality of memory cells include a plurality of strings of memory cells, each of the strings of memory cells being connected in series between a bit line of the memory device and a common source line of the memory device. Accordingly, various embodiments of the present invention may preclude or reduce the likelihood of memory cells being insufficiently programmed because of a raised potential on a common source line during program-verify operations.

In further embodiments of the present invention, semiconductor memory devices include a memory cell array having a plurality of bit lines, a plurality of word lines, and a plurality of memory cells arranged in a matrix of the word lines and the bit lines. A page buffer group has a plurality of page buffers and is connected to the bit lines of the memory cell array. A column-pass gate circuit is connected between the page buffer group and a data bus. Each of the page buffers may include a first transistor having a drain connected to a first node, a source, and a gate connected to receive a first control signal; a first latch having a first latch node connected to the source of the first transistor and a second latch node; a second transistor having a drain connected to a sensing node, a source connected to the first node, and a gate connected to receive a second control signal; a second latch having a third latch node connected to the source of the second transistor and the first node, and a fourth latch node; a third transistor having a drain connected to the fourth latch node, a source, and a gate connected to the sensing node; a fourth transistor having a drain connected to the fourth latch node, a source, and a gate connected to the first latch node; and a fifth transistor having a drain connected to the sources of the third and fourth transistors, a source grounded, and a gate connected to receive a third control signal.

The first control signal may be activated such that data to be programmed is latched at the first latch node when a program operation commences. The data to be programmed may be latched at the third latch node of the second latch. When a program-verify operation commences, the third and fourth latch nodes of the second latch may be reset. The third control signal may be activated such that program-inhibit data is maintained at the third latch node of the second latch when either one of data on the sensing node and data on the first latch node of the first latch is program-inhibit data.

In other embodiments of the present invention, each of the page buffers includes a sixth transistor having a drain connected to the second latch node of the first latch, a source grounded, and a gate connected to receive a fourth control signal. The page buffers further include a seventh transistor having a drain connected to the first latch node of the first latch, a source, and a gate connected to the sensing node and an eighth transistor having a drain connected to the source of the seventh transistor, a source grounded, and a gate connected to receive a fifth control signal.

The fourth control signal may be activated to reset the first latch node of the first latch when a normal read operation commences. The fifth control signal may be activated to selectively discharge the first latch node of the first latch, based on a logic level of the sensing node, during a normal read operation. The sensing node may be discharged into a ground voltage after the first latch node of the first latch is set according to a logic level of the sensing node during the normal read operation. Furthermore, the third control signal may be activated to establish the third latch node of the second latch into data on the first latch node of the first latch, after the sensing node is discharged, during the normal read operation.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element such as a layer, region or substrate is referred to as being "on" or "connected to" or "coupled to" another element, it can be directly on or connected or coupled to the other element or intervening elements may also be present. In contrast, when an element is referred to as being "directly on" or "directly connected" or "directly coupled" to another element, there are no intervening elements present.

Each embodiment described and illustrated herein includes its complementary conductivity type embodiment as well. References to source and drain of transistors herein are interchangeable and intended to encompass complementary conductivity type transistors or alternate technology type transistors except where a specific transistor type is referenced.

Figure 3:
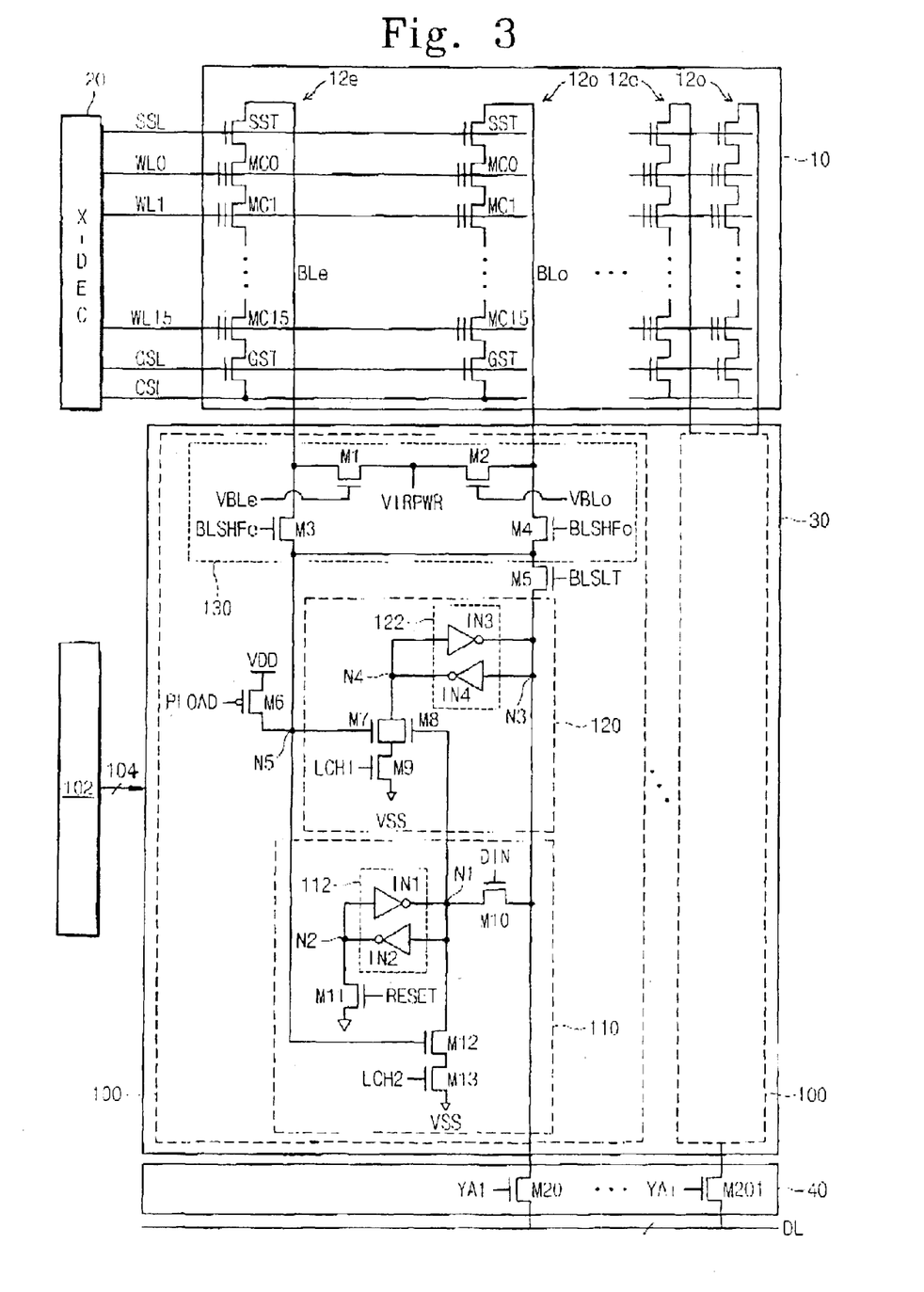
FIG. 3 is a circuit diagram of a NAND-type flash memory device according to some embodiments of the present invention.

The present invention will now be further described with reference to FIGS. 3–8. FIG. 3 is a circuit diagram illustrating a NAND-type flash memory device according to some embodiments of the present invention. As shown in FIG. 3, the memory device includes a memory cell array 10, a row decoder 20, a page buffer group 30, a column-pass gate circuit 40 and a control circuit 102. The memory cell array 10 includes a plurality of memory cell strings 12, each of which extends in the column direction. Each of the strings 12 includes a string selection transistor SST, a ground selection transistor GST, and a plurality of serially connected memory cell transistors. More particularly, FIG. 3 illustrates each string 12 as including sixteen (16) memory cells MC0–MC15 connected in series between the selection transistors SST and GST. A drain of the string selection transistor SST in each column is connected to a corresponding bit line and a gate of the string selection transistor SST is connected to a string selection line SSL. A source of the ground selection transistor GST is connected to a common source line CSL and a gate of the ground selection transistor GST is connected to a ground selection line GSL.

Each of the memory cells MC0–MC15 is illustrated as a floating gate transistor that has a control gate, a floating gate, a source, and a drain. The control gates of memory cells MC0–MC15 in each string are coupled with corresponding word lines WL0–WL15. The word lines WL0–WL15 are connected to the row decoder 20 (noted as "X-DEC" in FIG. 3).

The illustrated page buffer group 30 includes a plurality of page buffers (buffer circuits) 100. For the embodiments shown in FIG. 3, one page buffer 100 is associated with two adjacent strings 12e and 12o. For ease of explanation, a single page buffer 100 is detailed in FIG. 3 but it is to be understood that the plurality of page buffers may each be similarly configured. As shown in FIG. 3, the page buffer 100 includes an NMOS transistor M5, a PMOS transistor M6, the first latch circuit 110, the second latch circuit 120, and a bit line selecting and biasing circuit 130. The bit line selecting and biasing circuit 130 selects one of the corresponding bit lines BLe and BLo and connects the selected bit line to the first and second latch circuits 110 and 120 at the sensing (sense) node N5. The NMOS transistor M5 has a gate connected to receive a control signal BLSLT, a drain connected to a node N3 and a source connected to the node N5. The PMOS transistor M6 has a gate connected to receive a control signal PLOAD, a source connected to a power supply voltage VDD and a drain connected to the node N5. The PMOS transistor M6 supplies current to a selected bit line through the bit line selecting and biasing circuit 130 based on to a voltage level of the control signal PLOAD.

The first latch circuit 110 has a first latch node N1 and a second latch node N2. The second latch circuit 120 has a third latch node N3 and a fourth latch node N4. The third latch node N3 is coupled to a data line DL through the column pass gate circuit 40 and to the sense node N5 through the transistor M5.

The first latch circuit 110 receives data transferred through the column-pass gate circuit 40 and latches the received data until program and program-verify operations are completed. As illustrated in FIG. 3, the first latch circuit 110 includes four NMOS transistors M1, M11, M12, and M13 and a first latch 112 including two inverters IN1 and IN2. The NMOS transistor M10 is connected between the first latch node N1 and the third latch node N3 (and to the column-pass gate circuit 40), and transfers data to be programmed from the column-pass gate circuit 40 to the latch 112 responsive to a control signal DIN. The first latch node N1 is connected to an output of the inverter IN1 and an input of the inverter IN2.

The NMOS transistor M11 is connected between the second latch node N2 (interconnection of an input of the inverter IN1 and an output of the inverter IN2) and a ground voltage VSS, and discharges the node N2 responsive to a control signal RESET. Thus, the NMOS transistor M11 may be used to allow charging of the node N1 up to the power supply voltage through the inverter IN1. The NMOS transistors M12 and M13 are connected in series between the first latch node N1 and the ground voltage VSS. A gate of the NMOS transistor M12 is connected to the sense node N5 and a gate of the NMOS transistor M13 is connected to receive a control signal LCH2.

The second latch circuit 120 receives data transferred through the column-pass gate circuit 40 and stores the received data until a program operation is completed. The second latch circuit 120 latches data on the third latch node N3 based on latched data in the first latch circuit 110 (first latch node N1) and data on the sense node N5 during a program-verify operation. As shown in FIG. 3, the second latch circuit 120 includes three NMOS transistors M7, M8, and M9 and a latch 122 that includes two inverters IN3 and IN4. An output of the inverter IN3 and an input of the inverter IN4 are connected to the third latch node N3 (and to a data line DL through the column-pass gate circuit 40). An input of the inverter IN3 and an output of the inverter IN4 are connected to the fourth latch node N4. The NMOS transistor M7 has a drain connected to the fourth latch node N4 and a gate connected to the sense node N5. The NMOS transistor M8 has a drain connected to the fourth latch node N4 and a gate connected to the first latch node N1 in the first latch circuit 110. The NMOS transistor M9 has a gate connected to a control signal LCH1, a drain connected to sources of the transistors M7 and M8 and a source connected to the ground voltage VSS.

For some embodiments of the present invention, as illustrated in FIG. 3, the bit line selecting and biasing circuit 130 includes four NMOS transistors M1, M2, M3, and M4. The NMOS transistor M1 is connected between a signal line VIRPWR and a bit line BLe and is turned on/off by a control signal VBLe. The NMOS transistor M2 is connected between the signal line VIRPWR and a bit line BLo and is turned on/off by a control signal VBLo. The NMOS transistor M3 is connected between the bit line BLe and the sense node N5 and is turned on/off by a control signal BLSHFe. The NMOS transistor M4 is connected between the bit line BLo and the sense node N5 and is turned on/off by a control signal BLSHFo.

The control circuit 102 is coupled to the page buffer group 30 to provide control signals 104. The control circuit 102 is configured to generate various of the control signals described with reference to FIG. 3 as will now be further described with reference to the timing diagrams of FIGS. 4, 5 and 8 and the flowchart of FIG. 6.

Figure 4:
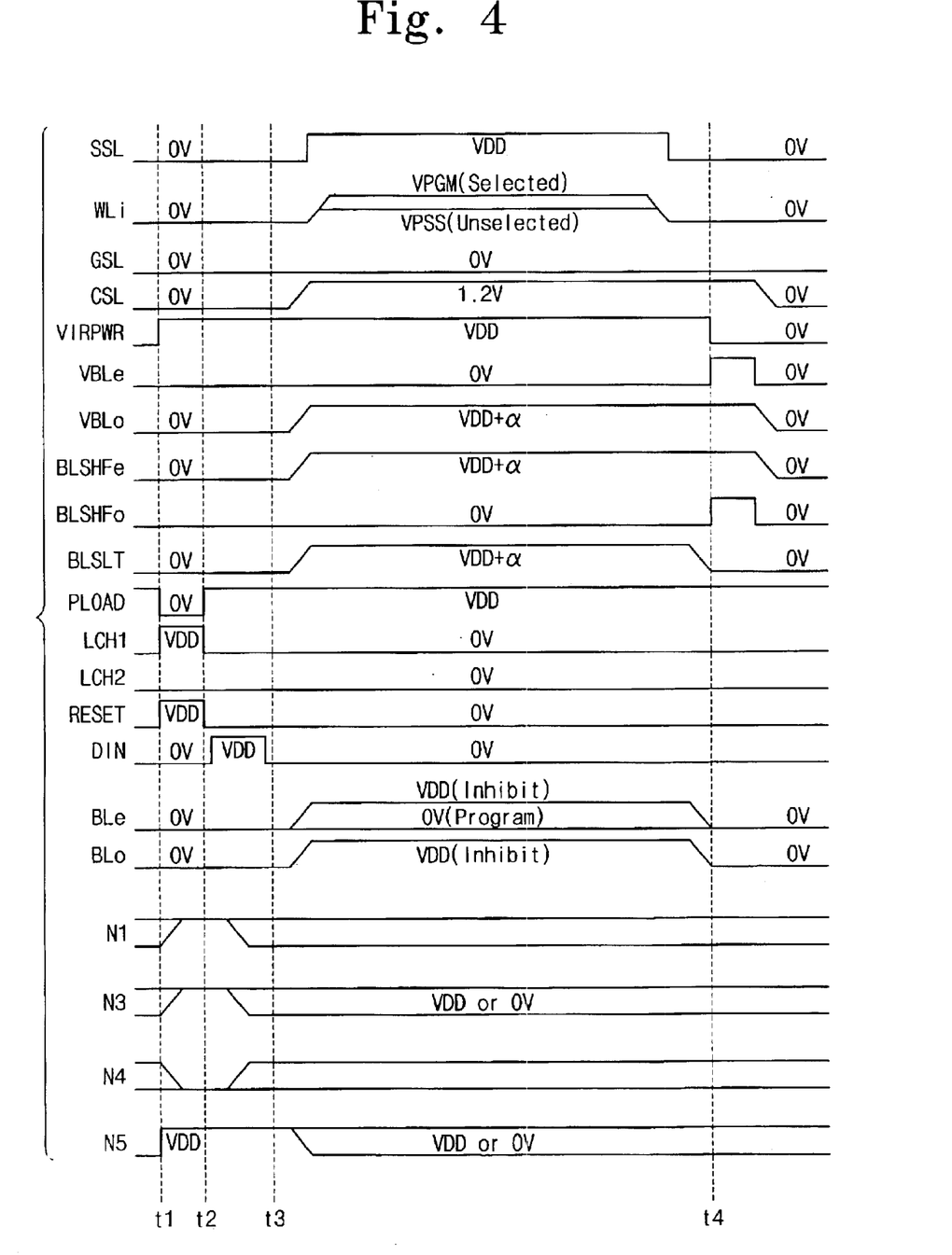
FIG. 4 is a timing diagram illustrating operations for controlling the circuit of FIG. 3 for a program operation according to some embodiments of the present invention.
Figure 5:
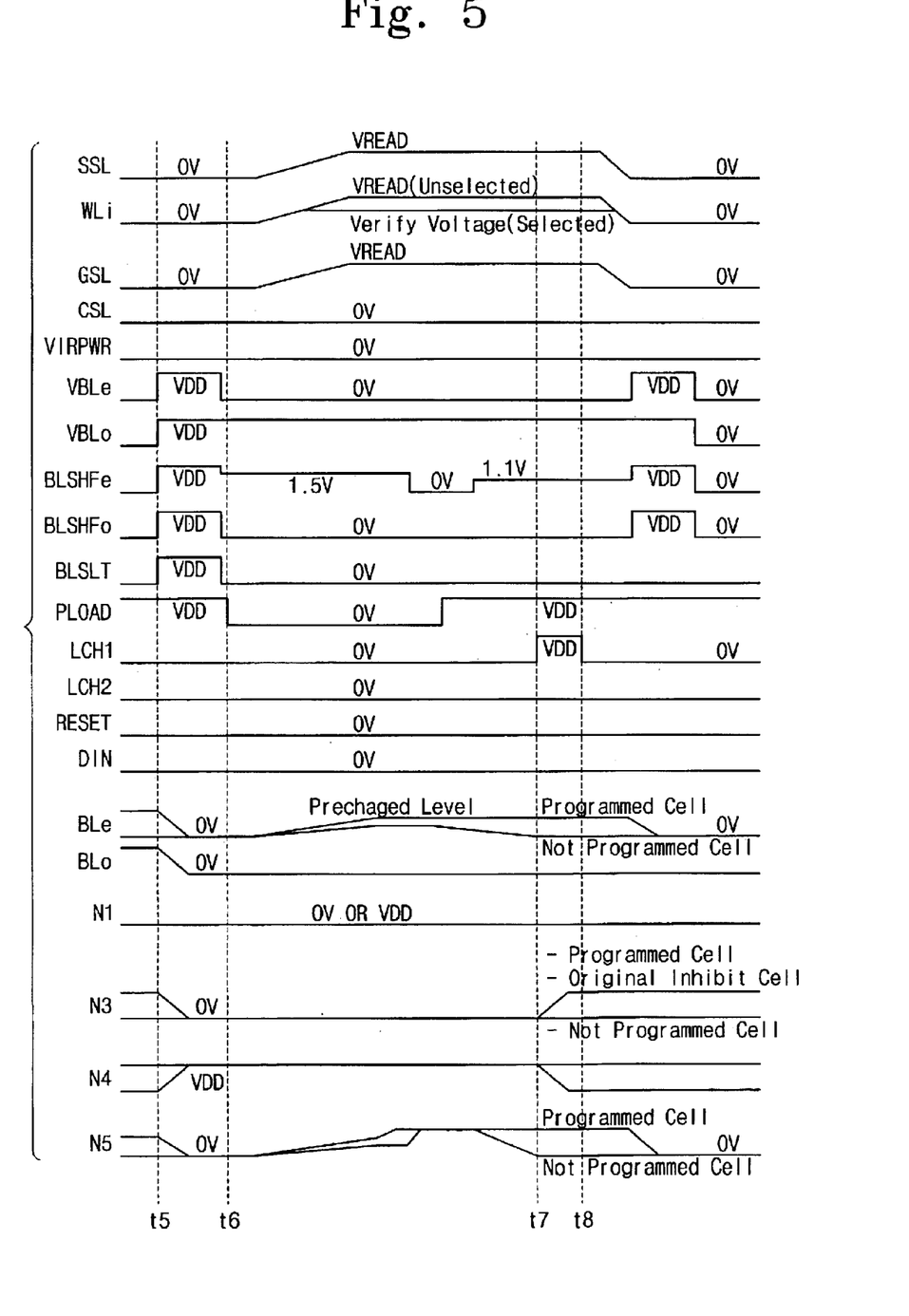
FIG. 5 is a timing diagram illustrating operations for controlling the circuit of FIG. 3 for a program-verify operation according to some embodiments of the present invention.
Figure 6:
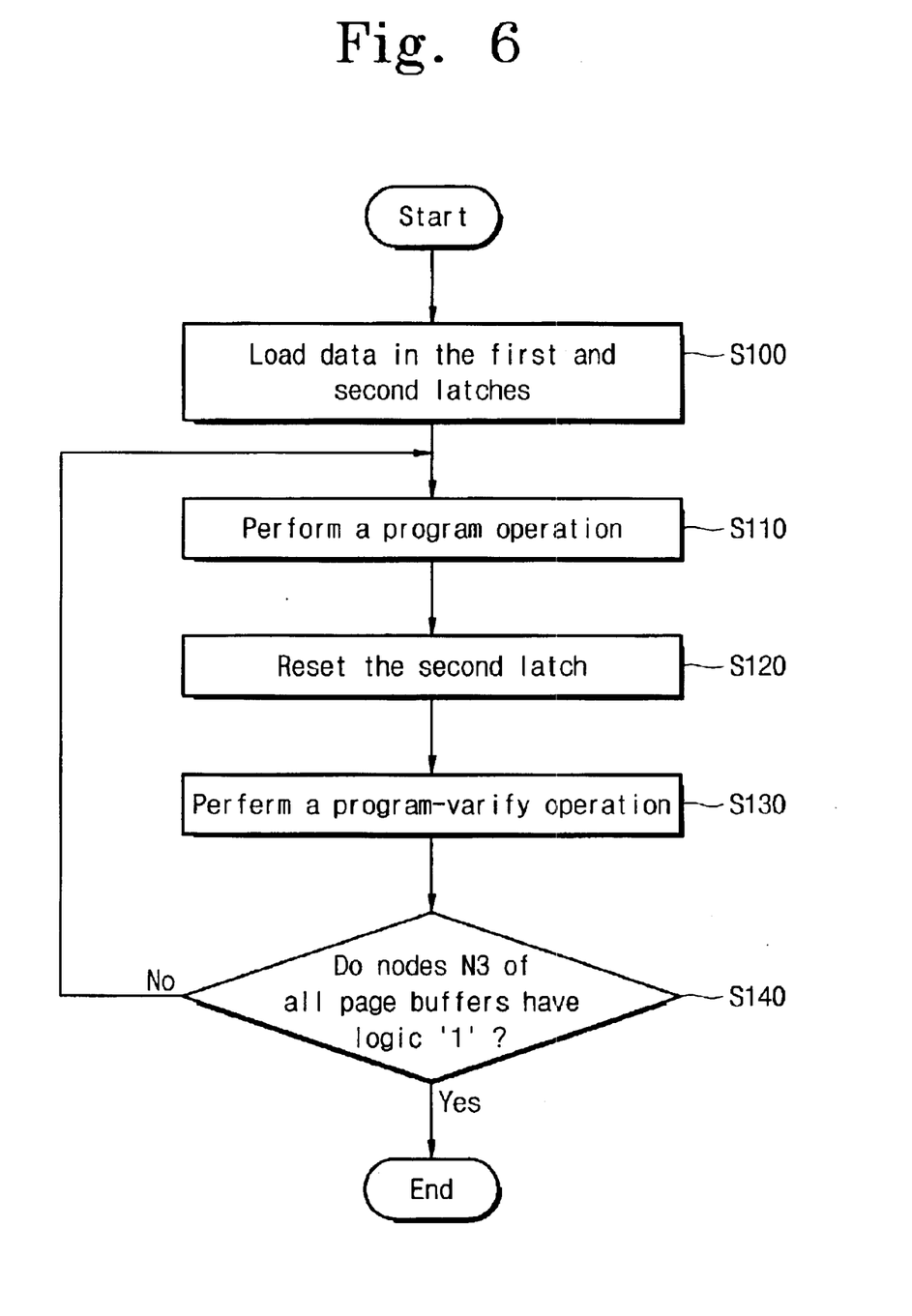
FIG. 6 is a flowchart diagram illustrating program and program-verify operations according to some embodiments of the present invention.

FIG. 4 is a timing diagram illustrating operations for controlling the circuit of FIG. 3 for a program operation according to some embodiments of the present invention. FIG. 5 is a timing diagram similarly illustrating program-verify operations. FIG. 6 is a flowchart illustrating operations for program and program-verify operations as shown in the timing diagrams of FIGS. 4–5 according some embodiments of the present invention.

Referring first to FIG. 6 (and FIG. 3), at block S100, data to be programmed to memory cells of a selected page is loaded to the first latch 112 and the second latch 122. The load procedure includes resetting of nodes N1 and N3 to a logic '1' as illustrated between times t1 and t2 of FIG. 4 and programming of data loaded to nodes N1 and N3 through a column-pass gate circuit 40 between times t2 and t3 of FIG. 4. Responsive to the control signal PLOAD being activated low and the control signal LCH1 being activated high, NMOS transistors M7 and M9 are turned on. The third latch node N3 is established at a logic high level (logic '1') through the inverter IN3 of the second latch 122. When the control signal RESET is activated high, the NMOS transistor M11 is turned on. The first latch node N1 is established at a logic high level through the inverter IN1 of the first latch 112. Subsequently, at time t2 (FIG. 4), the control signal PLOAD is inactivated high and the control signals LCH1 and RESET are inactivated low. Afterwards, when the control signal DIN is activated high, data to be programmed is transferred to the nodes N1 and N3 from the column-pass gate circuit 40. For example, if data '0' is received through the column-pass gate circuit 40, the nodes N1 and N3 have a logic low level. If data '1' is received through the column-pass gate circuit 40, the nodes N1 and N3 have a logic high level.

While a memory cell corresponding to a page buffer where data '0' is to be loaded is programmed, a memory cell corresponding to a page buffer where data '1' is loaded is program-inhibited. In other words, the threshold voltage for each data state must be set based on charging or not charging of the floating gate of the floating gate transistors of the respective memory cells.

At block S110, a program operation for selected memory cells is carried out based on states of the loaded data. The program operation is illustrated in FIG. 4 as being carried out between times t3 and t4. During the program operation, as illustrated in FIG. 4, the control signals VBLo and BLSHFe have a logic high level of VDD+α, and the control signals VBLe and BLSHFo have a logic low level of VSS. Under these conditions, the bit line BLe is connected to the sense node N5 through the NMOS transistor M3 and the bit line BLo is connected to the line VIRPWR through the NMOS transistor M2. Subsequently, selected memory cells of a page or word line are programmed or program-inhibited based on the loaded data states.

At block S120, the second latch circuit 120 is reset. As illustrated in FIG. 5, between time t5 and t6 the control signals VBLe, VBLo, BLSHFe, BLSHFo, BLSLT, and PLOAD have a logic high level (VDD). The control signal VIRPWR has a logic low level (VSS or 0V). Thus, between times t5 and t6, the third latch node N3 is reset to a logic '0.'

At block S130, a program-verify operation is performed. If insufficiently programmed memory cells are seen as sufficiently programmed memory cells (i.e., satisfying the verify threshold reference voltage) owing to the CSL noise, the third latch node N3 is established at a logic '1' between times t7 and t8 of FIG. 5. Also, for a program-inhibited memory cell, the third latch node N3 is set to a logic '1' between times t7 and t8 of FIG. 5. On the other hand, if a selected memory cell is not programmed sufficiently, the third latch node N3 is established at a logic '0' level.

The program-verify operation of block S130 will now be further described below with reference to FIGS. 3 and 5. For purposes of this explanation, it is assumed that a potential of the common source line CSL is raised by about 0.7V owing to current flowing through un-programmed memory cells and that a threshold voltage of an insufficiently programmed memory cell is about 0.3V. Voltage levels of control signals used for the program-verify procedure S130 are illustrated in FIG. 5. More particularly, between times t6 and t7, a read voltage VREAD is applied to the string and ground selection lines SSL and GSL, a voltage of about 0.8V is applied to a selected word line, and a voltage of about 4.5V is applied to unselected word lines. Concurrently, the ground voltage VSS is applied to the control signals VBLe and BLSLT and the control signal VBLo is retained at the power supply voltage VDD. Between times t6 and t7, 1.5V, VSS, and 1.1V voltage levels are sequently applied to the control signal BLSHFe and the ground voltage is applied to the control signal PLOAD. Between times t7 and t8, the control signal LCH1 is activated high. Accordingly, data to be latched at the node N3 is determined based on the logic level of the node N1 and whether a selected memory cell is programmed. At this time, a pre-charged level, that is, a logic '1' continues to be maintained at the sense node N5 of a page buffer that corresponds to a sufficiently programmed cell and to a memory cell that is judged as a sufficiently programmed cell owing to the CSL noise even though it is not programmed sufficiently. Thus, the node N3 is set to a logic '1' because a current path is formed between the node N4 and the ground voltage VSS through the NMOS transistors M7 and M9 in the second latch circuit 120.

If a selected memory cell is not programmed, a pre-charged voltage on the sense node N5 is discharged through a corresponding string 12. In this case, as the NMOS transistor M7 is turned off, the fourth latch node N4 retains a logic '0' state as a reset state. If data held in the latch 112 at the first latch node N1 is a logic '1,' when the control signal LCH1 is activated between times t7 and t8, a current path is formed between the node N4 and the ground voltage VSS through the NMOS transistors M8 and M9. The node N4 then is established at a logic '0' level.

At block S140, it is determined whether the third latch node N3 has a logic '1' level. If the third latch nodes N3 of all page buffers 100 have a logic '1' level, the program operation is completed. If at least one of the nodes N3 has a logic '0' level, the procedure returns to block S110 to repeat program and program-verify operations.

In accordance with various embodiments of the present invention, when the next program cycle is carried out, the number of programmed memory cells may be increased, which may reduce the CSL noise. Accordingly, a memory cell insufficiently programmed in a previous program cycle may be correctly identified as an on-cell during the subsequent program-verify operation at block S130. The logic level of the node N3 transitions from a logic high level (VDD) to a logic low level (VSS). That is, the node N3 is reset to a logic '0' level.

Figure 7:
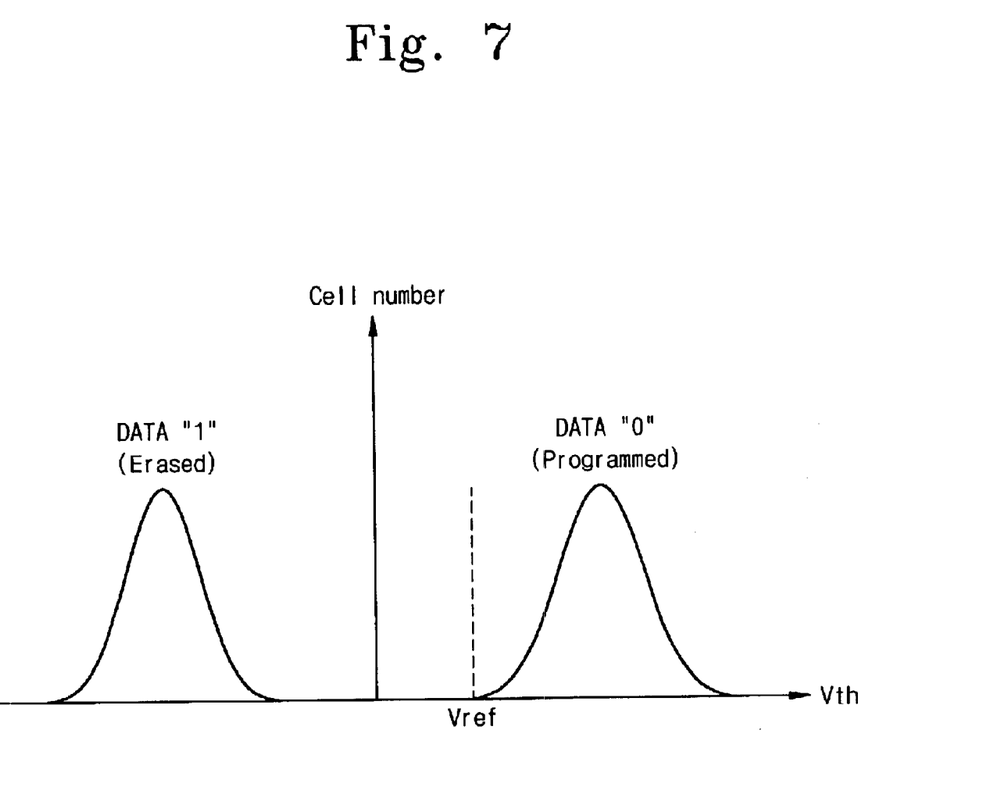
FIG. 7 is a graph illustrating a threshold voltage distribution of on-cells and off-cells that may result from program-verify operations in accordance with some embodiments of the present invention.

If resetting of the node N3 as shown at block S120 for various embodiments of the present invention is not, a selected memory cell may be judged as a successfully programmed cell even though it is not programmed sufficiently (threshold voltage not sufficient). As a result, the node N3 may be set to a logic '1' level. Such a memory cell may then continue to be program-inhibited during subsequent program cycles. Accordingly, various embodiments of the present invention provide for resetting the node N3 to a logic '0' level before the program-verify operation is performed at block S130. Thus, although an insufficiently programmed memory cell may be judged as a successfully programmed cell, due to the CSL noise, it can be reprogrammed during a subsequent program cycle when the node N3 is reset to a logic '0' level. As a result, as illustrated in the graph of FIG. 7, threshold voltages of programmed memory cells may be distributed at a higher region than the reference voltage Vref (=0.7V) that is used to judge whether a memory cell is normally programmed.

Thus with a page buffer structure according to some embodiments of the present invention, although an insufficiently programmed cell is detected as an off-cell due to the CSL noise, it is reprogrammed during repeated program cycle(s) so it may be provided a threshold voltage corresponding to an off-cell. Therefore, under-programming of memory cells, and resulting device failures, may be reduced or eliminated.

Figure 8:
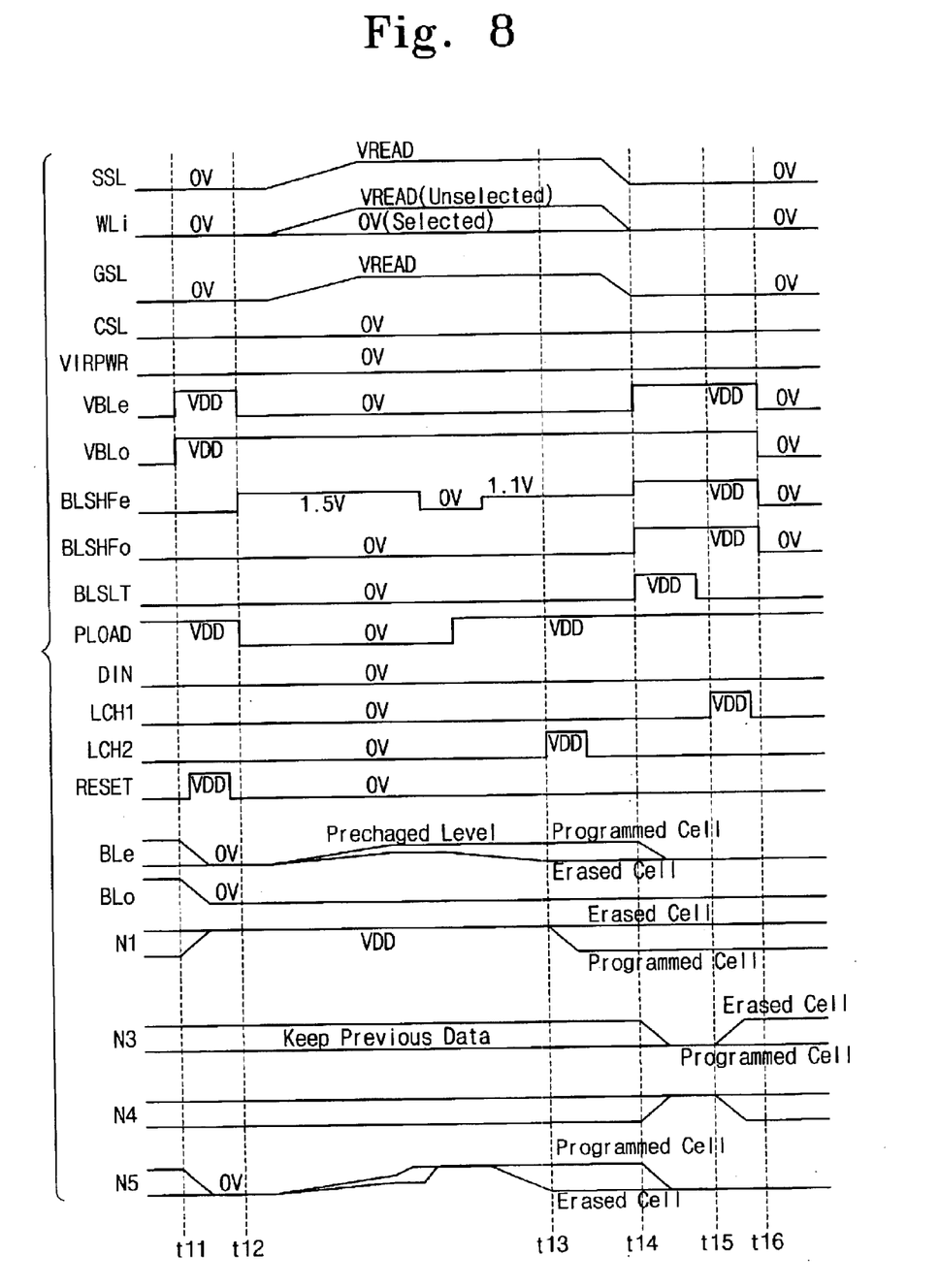
FIG. 8 is a timing diagram illustrating operations for controlling the circuit of FIG. 3 for a read operation according to some embodiments of the present invention.

FIG. 8 is a timing diagram illustrating operations for controlling the circuit of FIG. 3 for a read operation according to embodiments of the present invention. Referring to FIG. 8 (and FIG. 3), between times t11 and t12, a ground voltage VSS is applied to a string selection line SSL, a ground selection line GSL, and word lines WL0–WL15. Concurrently, the ground voltage VSS is applied to the BLSHFe and BLSHFo control lines and a-power supply voltage VDD is applied to the PLOAD control line. As a result, the bit lines BLe and BLo and the sense node N5 are reset to the ground voltage VSS. Furthermore, as the control signal RESET is activated high, the node N1 is established at a logic high level.

Between times t12 and t13, the bit line BLe and the node N5 are pre-charged as the control signal VBLe is set to the ground voltage VSS, the control signal BLSHFe has about a 1.5V level and the control signal PLOAD has the ground voltage VSS. Concurrently, the ground voltage VSS is applied to a selected word line and a read voltage VREAD is applied to unselected word lines. Under these conditions, if a selected memory is a programmed cell, the bit line BLe maintains a pre-charged voltage, so that the sense node N5 continues to maintain a pre-charged voltage. On the other hand, if a selected memory cell is an erased cell, a pre-charged voltage of the bit line BLe is discharged into the ground voltage VSS through the selected memory cell and a voltage of the sense node N5 is also discharged into the ground voltage VSS.

When the control signal LCH2 is activated high between times t13 and t14, the voltage level of the node N1 is determined based on whether a selected memory cell is programmed. For example, when a selected memory cell is programmed, the node N1 is discharged into the ground voltage VSS. On the other hand, when a selected memory cell has an erased state, or when the sense node N5 has a logic low level, the node N1 maintains a logic high level (VDD).

As the power supply voltage VDD is applied to the VBLe, BLSHFe, BLSHFo, and BLSLT at time t14, the node N5 is discharged into the ground voltage VSS. When the control signal LCH1 is activated high at time t15, the logic state of the node N3 is established based on the logic level of the node N3. For example, if the node N1 has a logic high level, the node N3 is set to a logic high level. If the node N1 has a logic low level, the node N3 is established at a logic low level. The voltage (state) of the node N3 is transferred to the data line DL through a column-pass gate circuit 40.

As described above, for the illustrated NAND-type flash memory device, during a a normal read operation, data sensed through a bit line BLe and a sense node N5 is latched at a node N1 of the first latch 112. The data at the node N1 is also latched at a node N3 of the second latch 122.

In addition, flash memory devices according to various embodiments of the present invention provide a copy-back mode where data is sensed from memory cells of any page and then the sensed data is programmed in memory cells of a different page. In order to perform such a copy-back mode, a conventional NAND-type flash memory device typically uses an inverse read mode or check-bit cells. However, using a page buffer structure as described for various embodiments of the present invention, data read out from memory cells of any page is latched at nodes N1 and N3, and then may be programmed in memory cells of a different page through the aforementioned program procedures. However, operations related to resetting the nodes N1 and N3 as described above are skipped when the copy-back mode is performed. Accordingly, the NAND-type flash memory device according to some embodiments of the present invention may perform the copy-back mode without the need for using an inverse read mode or check-bit cells.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A programmable memory device comprising:
   a memory cell having an associated bit line;
   a buffer circuit that couples the bit line to a data line, the buffer circuit having a sense node coupled to the bit line and including a latch circuit having a latch node coupled to the data line; and
   a control circuit that resets the latch node between a program operation of the memory cell and a program-verify operation, wherein the program operation and the program verify operation, with the reset of the latch mode therebetween, occur in a single memory cycle.

2. The memory device of claim 1 wherein the memory device comprises a NAND-type flash memory device and wherein the memory cell comprises one of a string of memory cells connected in series between the bit line and a common source line.

3. The memory device of claim 2 further comprising a transistor coupling the data line to the latch node and a transistor coupling the latch node to the sense node.

4. A programmable NAND-type flash memory device comprising:
   a memory cell having an associated bit line, the memory cell comprising one of a string of memory cells connected in series between the bit line and a common source line;
   a buffer circuit that couples the bit line to a data line, the buffer circuit having a sense node coupled to the bit line and including a latch circuit having a latch node coupled to the data line; and
   a control circuit that resets the latch node between a program operation of the memory cell and its corresponding program-verify operation;
   a transistor coupling the data line to the latch node and a transistor coupling the latch node to the sense node; and
   wherein the latch node comprises a third latch node and wherein the latch circuit comprises:
      a first latch circuit having a first latch node selectively coupled to the third latch node and a second latch node selectively coupled to a first reference voltage; and
      a second latch circuit coupled to the third latch node and having a fourth latch node coupled to the first reference voltage by a select circuit, the select circuit being responsive to signals on the first latch node and the sense node.

5. The memory device of claim 4 wherein the control circuit is configured to selectively couple the first latch node to the third latch node to latch data on the first latch node during a program operation.

6. The memory device of claim 5 wherein the second latch control circuit is configured to latch the data to the third latch node during the program operation.

7. The memory device of claim 4 wherein the control circuit is configured to maintain program-inhibit data at the third latch node when data on the first latch node or data on the sense node comprise program-inhibit data.

8. The memory device of claim 4 wherein the control circuit is configured to reset the first latch node during a read operation.

9. The memory device of claim 4 wherein the control circuit is configured to selectively discharge the first latch node responsive to data on the sense node during a read operation.

10. The memory device of claim 9 wherein the control circuit is configured to match data on the third latch node to data on the first latch node after discharge of the sense node during the read operation.

11. A method for programming a programmable semiconductor memory device comprising:
programming a plurality of memory cells of the semiconductor memory device;
resetting latched programming data presented to ones of the plurality of memory cells; and then
performing a program-verify operation verifying the programming of the plurality of memory cells after resetting latched programming data in a single memory cycle.

12. The method of claim 11 wherein the memory device comprises a NAND-type flash memory device and wherein the plurality of memory cells comprise a plurality of strings of memory cells, ones of the strings including a plurality of memory cells connected in series between a bit line of the memory device and a common source line of the memory device.

13. A semiconductor memory device comprising:
a memory cell array having a plurality of bit lines, a plurality of word lines, and a plurality of memory cells arranged in a matrix of the word lines and the bit lines;
a page buffer group having a plurality of page buffers and connected to the bit lines of the memory cell array; and
a column-pass gate circuit connected between the page buffer group and a data bus,
wherein each of the page buffers includes:
a first transistor having a drain connected to a first node, a source, and a gate connected to receive a first control signal;
a first latch having a first latch node connected to the source of the first transistor and a second latch node;
a second transistor having a drain connected to a sensing node, a source connected to the first node, and a gate connected to receive a second control signal;
a second latch having a third latch node connected to the source of the second transistor and the first node, and a fourth latch node;
a third transistor having a drain connected to the fourth latch node, a source, and a gate connected to the sensing node;
a fourth transistor having a drain connected to the fourth latch node, a source, and a gate connected to the first latch node; and
a fifth transistor having a drain connected to the sources of the third and fourth transistors, a source grounded, and a gate connected to receive a third control signal.

14. The semiconductor memory device according to claim 13, wherein each of the page buffers is connected to two adjacent ones of the bit lines, and the sensing node of each page buffer is connected to either one of corresponding bit lines.

15. The semiconductor memory device according to claim 13, wherein the first control signal is activated such that data to be programmed is latched at the first latch node when a program operation commences.

16. The semiconductor memory device according to claim 15, wherein the data to be programmed is latched at the third latch node of the second latch.

17. The semiconductor memory device according to claim 13, wherein the third and fourth latch nodes of the second latch are reset when a program-verify operation commences.

18. The semiconductor memory device according to claim 13, wherein the third control signal is activated such that program-inhibit data is maintained at the third latch node of the second latch when either one of data on the sensing node and data on the first latch node of the first latch is program-inhibit data.

19. The semiconductor memory device according to claim 13, further comprising:
a sixth transistor having a drain connected to the second latch node of the first latch, a source grounded, and a gate connected to receive a fourth control signal;
a seventh transistor having a drain connected to the first latch node of the first latch, a source, and a gate connected to the sensing node; and
an eighth transistor having a drain connected to the source of the seventh transistor, a source grounded, and a gate connected to receive a fifth control signal.

20. The semiconductor memory device according to claim 19, wherein the fourth control signal is activated to reset the first latch node of the first latch when a normal read operation commences.

21. The semiconductor memory device according to claim 19, wherein the fifth control signal is activated to selectively discharge the first latch node of the first latch based on a logic level of the sensing node, during a normal read operation.

22. The semiconductor memory device according to claim 21, wherein the sensing node is discharged into a ground voltage after the first latch node of the first latch is set according to a logic level of the sensing node during the normal read operation.

23. The semiconductor memory device according to claim 22, wherein the third control signal is activated to establish the third latch node of the second latch into data on the first latch node of the first latch, after the sensing node is discharged during the normal read operation.

24. The semiconductor memory device according to claim 13, wherein the first latch is formed of a pair of inverters.

25. The semiconductor memory device according to claim 13, wherein the second latch is formed of a pair of inverters.

26. The method of claim 11, wherein programming a plurality of memory cells includes loading data to a latch node of a first latch of ones of the memory devices and to a latch node of a second latch of ones of the memory device and wherein resetting latched programming data includes resetting the latch node of the second latches of the memory device.

27. The method of claim 26 wherein the latch node of the first latches holds data during programming.

28. The method of claim 26 further comprising determining if a plurality of the latch nodes of the second latches have a logic high state.

* * * * *